United States Patent
Xu et al.

(10) Patent No.: US 12,334,426 B2
(45) Date of Patent: Jun. 17, 2025

(54) ARRAY SUBSTRATE, DISPLAY PANEL AND DISPLAY MODULE

(71) Applicant: KunShan Go-Visionox Opto-Electronics Co., Ltd, Jiangsu (CN)

(72) Inventors: Chuanzhi Xu, Kunshan (CN); Zhengfang Xie, Kunshan (CN); Yong Wu, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 497 days.

(21) Appl. No.: 17/979,290

(22) Filed: Nov. 2, 2022

(65) Prior Publication Data

US 2023/0052091 A1 Feb. 16, 2023

Related U.S. Application Data

(63) Continuation of application No. PCT/CN2021/103401, filed on Jun. 30, 2021.

(30) Foreign Application Priority Data

Sep. 21, 2020 (CN) .......................... 202010995977.7

(51) Int. Cl.
  *H01L 23/498* (2006.01)
  *H05K 1/18* (2006.01)
(52) U.S. Cl.
  CPC ....... *H01L 23/49838* (2013.01); *H05K 1/189* (2013.01); *H01L 23/4985* (2013.01);
  (Continued)

(58) Field of Classification Search
  CPC .......... H01L 23/49838; H01L 23/4985; H05K 1/189; H05K 2201/10128;
  (Continued)

(56) References Cited

U.S. PATENT DOCUMENTS 10,475,786 B1 * 11/2019 Tang .................... H05K 3/3436
2017/0287386 A1 * 10/2017 Oh ........................ G09G 3/2092
(Continued)

FOREIGN PATENT DOCUMENTS

| | | |
|---|---|---|
| CN | 107154218 A | 9/2017 |
| CN | 107329298 A | 11/2017 |

(Continued)

OTHER PUBLICATIONS

International search report issued on Sep. 16, 2021 in corresponding PCT Application No. PCT/CN2021/103401, 11 pages.
(Continued)

*Primary Examiner* — Kevin Quarterman
(74) *Attorney, Agent, or Firm* — Maier & Maier, PLLC

(57) ABSTRACT

An array substrate, a display panel and a display module. The array substrate includes a substrate including a non-display area. The non-display area includes a chip integration area. A first pad group is arranged in the chip integration area, the first pad group includes a plurality of first pads. A second pad group is arranged in the non-display area, each second pad group includes a plurality of second pads. A plurality of connecting lines are configured to electrically connect the second pads with the first pads. Lengths of the connecting lines are respectively electrically connected to the plurality of second pads in each second pad group arranged along a direction away from the first pad group increase.

19 Claims, 7 Drawing Sheets

(52) U.S. Cl.
CPC .............. *H05K 2201/10128* (2013.01); *H05K 2201/1053* (2013.01)

(58) Field of Classification Search
CPC ........ H05K 2201/1053; G02F 1/13452; G02F 1/13458; G09F 9/30; G09F 9/33; H10H 29/142; H10K 59/131
See application file for complete search history.

(56) References Cited

U.S. PATENT DOCUMENTS

| | | | |
|---|---|---|---|
| 2018/0235087 A1* | 8/2018 | Uchida | ................ H05K 3/3463 |
| 2020/0225545 A1 | 7/2020 | Zuo et al. | |
| 2020/0243022 A1 | 7/2020 | Lee et al. | |

FOREIGN PATENT DOCUMENTS

| | | |
|---|---|---|
| CN | 109119448 A | 1/2019 |
| CN | 110910804 A | 3/2020 |
| CN | 111031661 A | 4/2020 |
| CN | 111308815 A | 6/2020 |
| CN | 111367125 A | 7/2020 |
| CN | 111509001 A | 8/2020 |
| CN | 112102725 A | 12/2020 |
| KR | 20200097832 A | 8/2020 |

OTHER PUBLICATIONS

First Office Action issued on Nov. 17, 2021 in corresponding Chinese Application No. 202010995977.7, 17pages.

* cited by examiner

ARRAY SUBSTRATE, DISPLAY PANEL AND DISPLAY MODULE

CROSS-REFERENCE TO RELATED APPLICATION

This application is a continuation of International Application No. PCT/CN2021/103401, filed on Jun. 30, 2021, which claims priority to Chinese Patent Application No. 202010995977.7, filed on Sep. 21, 2020, both of which are hereby incorporated by reference in their entireties.

TECHNICAL FIELD

The present application relates to the field of display, and in particular to an array substrate, a display panel and a display module.

BACKGROUND

Flat display panels are widely used in various consumer electronic products such as mobile phones, TVs, personal digital assistants, digital cameras, notebook computers, desktop computers due to the advantages of high image quality, power saving, thin body and wide application range. The flat display panels are becoming the mainstream in display panels.

A flat display panel generally includes an array substrate. The array substrate includes a display area and a non-display area surrounding the display area, and the non-display area includes a chip integration area. In order to meet the design requirements of narrow frame of electronic products, the area of the non-display area on which the chip integration area is located needs to be reduced as much as possible. Under this condition, new requirements are also put forward for the circuit layout near the chip integration area.

SUMMARY

The present application provides an array substrate, a display panel and a display module.

In a first aspect, an embodiment of the present application provides an array substrate, including: a substrate including a display region and a non-display region surrounding the display region, wherein the non-display region includes a chip integration region arranged on one side of the display region along a first direction; a first pad group arranged in the chip integration region, wherein the first pad group includes a plurality of first pads arranged along a second direction intersecting with the first direction; at least one second pad group arranged in the non-display region, wherein the second pad group is arranged on at least one side of the chip integration region along the second direction, and each of the at least one second pad group includes a plurality of second pads arranged along the second direction; and a plurality of connecting lines configured to electrically connect the second pads with the first pads, wherein lengths of the connecting lines respectively electrically connected to the plurality of second pads in each of the at least one second pad group arranged along a direction away from the first pad group increase, wherein the plurality of second pads in each of the at least one second pad group include a plurality of alternating current (AC) signal pads and a plurality of direct current (DC) signal pads arranged on one side of all of the AC signal pads away from the first pad group.

In a second aspect, an embodiment of the present application provides a display panel, including the array substrate according to any one of the aforesaid embodiments of the first aspect of the present application.

In a third aspect, an embodiment of the present application provides a display module, including: a display panel according to any embodiment of the second aspect of the present application; a driving chip arranged in the chip integration area, wherein the driving chip is electrically connected to the first pad group; and a flexible printed circuit electrically connected to the second pad group.

DETAILED DESCRIPTION

Figure 1:
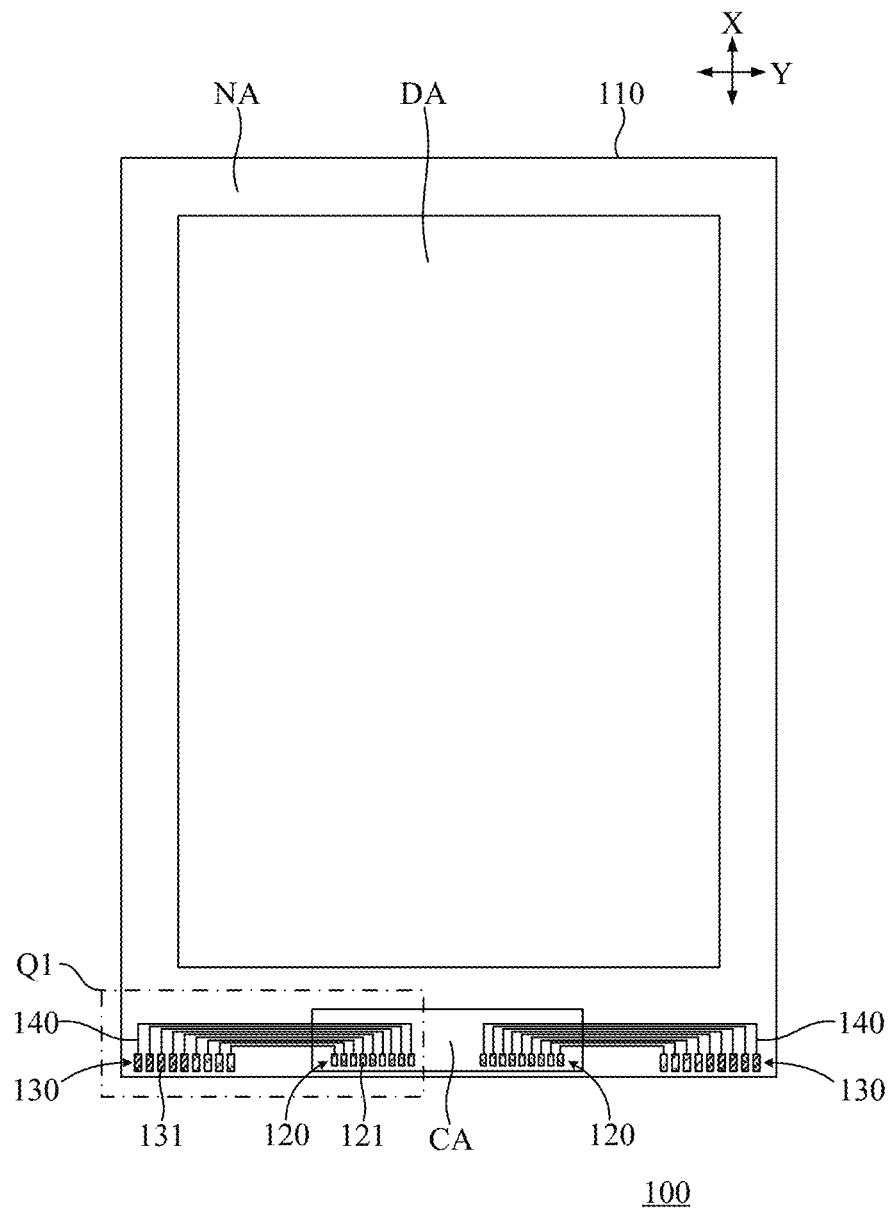
FIG. 1 is a schematic top view of a first embodiment of an array substrate according to the present application.
Figure 2:
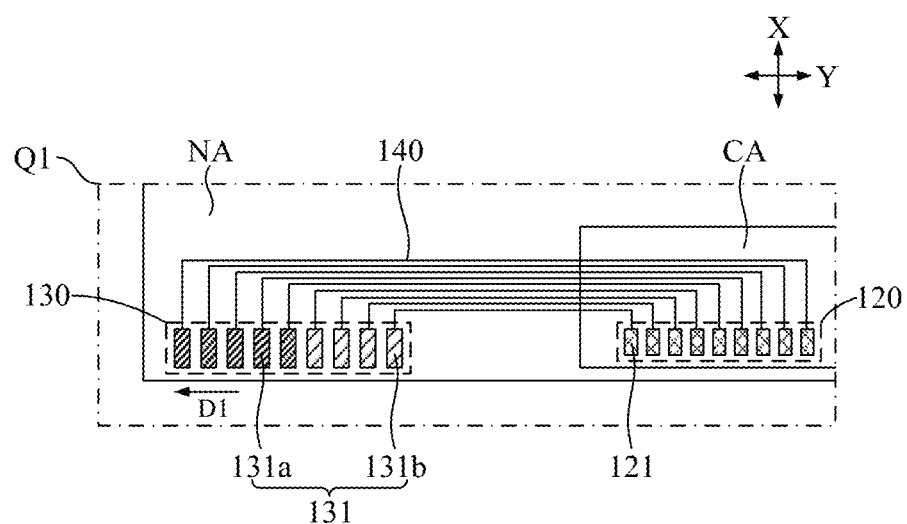
FIG. 2 is a schematic enlarged partial view of a Q1 region shown in FIG. 1.

Features and exemplary embodiments of various aspects of the present application will be described in detail below. In order to make the objects, technical solutions and advantages of the present application clear, the present application will be further described in detail below with reference to the drawings and specific embodiments. As shown in FIGS. 1 and 2, the array substrate 100 includes a substrate 110, a first pad group 120, at least one second pad group 130, and a plurality of connecting lines 140.

The substrate 110 may be rigid, such as a glass substrate, or flexible, such as a substrate including a polyimide (PI) layer. In this embodiment, taking the substrate 110 being a glass substrate as an example for description. The substrate 110 includes a display area DA and a non-display area NA surrounding the display area DA. The non-display area NA includes a chip integration area CA. The chip integration area CA is arranged on one side of the display area DA along a first direction X, and the chip integration area CA is an area for integrating a driving chip. In some optional embodiments, the display area DA is provided with pixel circuits in array for driving sub-pixels to perform grayscale display. After the display panel is formed on the basis of the array substrate 100, the display panel may be arranged with a plurality of sub-pixels in the display area DA, and each sub-pixel is electrically connected to a corresponding pixel circuit.

The first pad group 120 is arranged in the chip integration area CA. The first pad group 120 includes a plurality of first pads 121 arranged in a second direction Y intersecting with the first direction X. In this embodiment, taking the second direction Y being perpendicular to the first direction X as an example for description. Optionally, the above-mentioned pixel circuits or sub-pixels may be arranged in multiple rows and columns in the display area DA. The first direction X is, for example, the column direction of the arrangement of the pixel circuits, and the second direction Y is, for example, the row direction of the arrangement of the pixel circuits. After the driving chip is integrated on the array substrate 100, the first pad group 120 is configured to connect with an input terminal of the driving chip.

At least one second pad group 130 is arranged in the non-display area NA, wherein the second pad group 130 is provided on at least one side of the chip integration area CA along the second direction Y. Each of the at least one second pad group 130 includes a plurality of second pads 131 arranged in the second direction Y. In this embodiment, the second pad group 130 is provided on two sides of the chip integration area CA along the second direction Y. In some optional embodiments, the second pad group 130 may be provided only on one side of the chip integration area CA along the second direction Y.

The plurality of connecting lines 140 are configured to electrically connect the second pads 131 with the first pads 121. Lengths of the connecting lines 140 respectively electrically connected to the plurality of second pads 131 in each of the at least one second pad group 130 arranged along a direction D1 away from the first pad group 120 increase. After the driving chip is integrated with the array substrate 100, the second pad group 130 is configured to bond and connect with the flexible printed circuit. The first pad 121 and the second pad 131 connected by a same connecting line 140 transmit a same signal.

In this embodiment, the plurality of second pads 131 in each of the at least one second pad group 130 include a plurality of AC signal pads 131b and a plurality of DC signal pads arranged on one side of all of the AC signal pads 131b away from the first pad group 120.

The DC signal pad 131a is configured to transmit a DC signal, and the AC signal pad 131b is configured to transmit an AC signal. The DC signal is, for example, a DC power supply signal, a reference voltage signal, and other signals, and the AC signal is, for example, a high-frequency AC signal used for display panel.

The array substrate 100 according to the embodiment of the present application includes a first pad group 120 arranged in the chip integration area CA and a second pad group 130 arranged in the non-display area NA. The second pad group 130 is electrically connected to the first pad group 120 via the connecting lines 140. The first pad group 120 is configured to connect with an input terminal of the driving chip, and the second pad group 130 is configured to bond and connect with the flexible printed circuit. The second pad group 130 is disposed on at least one side of the chip integration area CA along the second direction Y. Both the chip integration area CA and the second pad group 130 are arranged in the same part of the non-display area NA along the first direction X. Therefore, the additional occupation of the non-display area NA by the second pad group 130 in the first direction X can be reduced, and a width of the non-display area NA along the first direction X can be reduced, thereby facilitating the realization of narrower frame design of the array substrate 100 and the corresponding display panel.

The lengths of the connecting lines 140 respectively electrically connected to the plurality of second pads 131 in each of the at least one second pad group 130 arranged along a direction D1 away from the first pad group 120 increase. The longer the length of the connecting line 140 is, the easier it is to configure a larger resistance to it. The plurality of second pads 131 in each of the at least one second pad group 130 include DC signal pads 131a and AC signal pads 131b. The DC signal pads 131a are configured to transmit a DC signal, and the AC signal pads 131b are configured to transmit an AC signal. The DC signal has a larger demand for the resistance of the connecting line 140, while the AC signal has a smaller demand for the resistance of the connecting line 140. In the array substrate 100 according to the embodiment of this application, each of the DC signal pads 131a in each of the at least one second pad group 130 is arranged on one side of all of the AC signal pads 131b away from the first pad group 120. That is, the connecting lines 140 connected to the DC signal pads 131a are longer and are easier to be configured with a large resistance, while the connecting lines 140 connected to the AC signal pads 131b are shorter and are easier to be configured with a low resistance, which solves the problem that the resistances of the plurality of connecting lines 140 are difficult to match, and also reduces the possibility of mutual interference between various types of signals in the plurality of connecting lines 140.

Continue to refer to FIG. 1 and FIG. 2, the first pads 121 respectively electrically connected to the plurality of second pads 131 in each of the at least one second pad group 130 arranged along a direction D1 away from the first pad group 120 are arranged in sequence along a direction away from the second pad group 130. The connecting lines 140 respectively electrically connected to the plurality of second pads 131 in each of the at least one second pad group 130 arranged along a direction D1 away from the first pad group 120 are arranged in sequence along the first direction X towards the display area DA.

In the array substrate 100 of the above embodiment, the connecting lines 140 respectively electrically connected to the plurality of second pads 131 in each of the at least one second pad group 130 arranged along a direction D1 away from the first pad group 120 are arranged in sequence along the first direction X towards the display area DA, such that the orthographic projections of the plurality of connecting lines 140 corresponding to each of the at least one second pad group 130 on the substrate 110 do not overlap with each other. In this manner, the plurality of connecting lines 140 may be formed in a same conductor layer at the same time without signal crosstalk with each other, which ensures stable signal transmission and improves fabrication efficiency of the array substrate 100.

Figure 3:
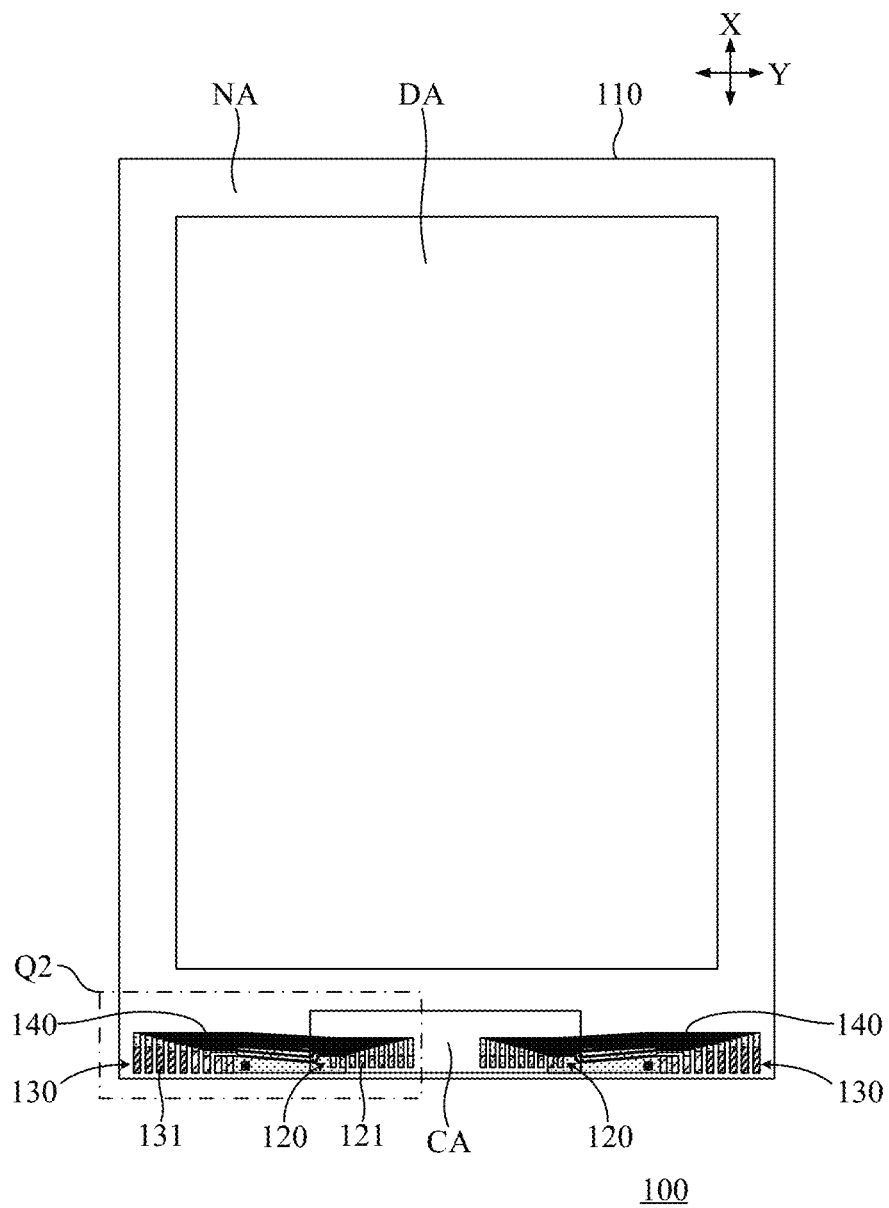
FIG. 3 is a schematic top view of a second embodiment of an array substrate according to the present application.
Figure 4:
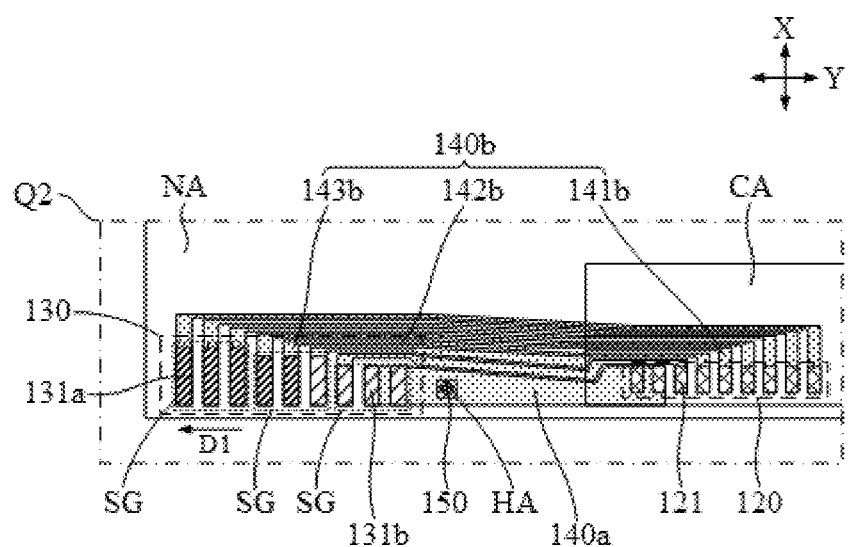
FIG. 4 is a schematic enlarged partial view of a Q2 region shown in FIG. 3.

Referring to FIGS. 3 and 4, a part of the structure of the second embodiment is the same as that of the first embodiment. The differences between the second embodiment and the first embodiment will be described below, and the similarities thereof will not be described in detail.

In the array substrate 100 of the second embodiment, the plurality of connecting lines 140 are configured to electrically connect the second pads 131 to the first pads 121. The lengths of the connecting lines 140 respectively electrically connected to the plurality of second pads 131 in each of the at least one second pad group 130 arranged along a direction D1 away from the first pad group 120 increase. The plurality of second pads 131 in each of the at least one second pad group 130 include a plurality of AC signal pads 131b and a plurality of DC signal pads 131a arranged on one side of all of the AC signal pads 131b away from the first pad group 120.

The connecting lines 140 respectively electrically connected to the plurality of second pads 131 in each of the at least one second pad group 130 arranged along a direction D1 away from the first pad group 120 are arranged in sequence along the first direction X towards the display area DA. In this embodiment, the plurality of second pads 131 in each of the at least one second pad group 130 include at least two subgroups SG in sequence along the second direction Y, each subgroup SG includes at least one of the second pads 131, and in each subgroup SG, lengths of the second pads 131 along the first direction X are equal to each other. Lengths along the first direction X of the second pads 131 in the at least two subgroups SG arranged along a direction D1 away from the first pad group 120 increase, such that the length of the second pad 131 closer to the first pad group 120 is shorter. The connecting lines 140 corresponding to the longer second pads 131 can half surround the connecting lines 140 corresponding to the shorter second pads 131, which facilitates the arrangement of the connecting lines 140.

As shown in FIG. 4, in this embodiment, the plurality of connecting lines 140 include a first connecting line 140a and a second connecting line 140b.

One end of the first connecting line 140a is connected to at least one second pad 131 in the second pad group 130 that is closest to the first pad group 120, and the other end of the first connecting line 140a is connected to at least one first pad 121 in the first pad group 120 that is closest to the second pad group 130, and the first connecting line 140a extends along the second direction Y. As mentioned above, the number of the first pads 121 and the number of the second pads 131 connected to each connecting line 140 may be adjusted according to design requirements.

The second connecting line 140b is arranged on one side of the first connecting line 140a along the first direction X towards the display area. The second connecting line 140b includes a first sub-connecting line 141b, a second sub-connecting line 142b, and a third sub-connecting line 143b connected in sequence. The first sub-connecting line 141b is connected to a first pad 121, and the third sub-connecting line 143b is connected to a second pad 131. An extending direction of at least one part of the first sub-connecting line 141b intersects with the second direction Y, an extending direction of at least one part of the third sub-connecting line 143b intersects with the second direction Y, and an extending direction of at least one part of the second sub-connecting line 142b is parallel to the second direction Y.

In the above embodiment, the first connecting line 140a is connected between the first pad 121 and the second pad 131 which are close to each other, so that the first connecting line 140a can extend along the second direction Y. That is, the first connecting line 140a extends along a direction substantially parallel to the second direction Y. In this manner, it is convenient to increase a width of the first connecting line 140a. In this embodiment, there may be a plurality of second connecting lines 140b, and the plurality of second connecting lines 140b are arranged in sequence on one side of the first connecting line 140a facing the display area DA. A width of at least one part of the first connecting line 140a may be approximately equal to a length of one of the connected first pads 121 and the second pads 131 along the first direction X. In this embodiment, the width of the first connecting line 140a is larger than the width of the second connecting line 140b, so that it is easier to configure the resistance of the first connecting line 140a to be smaller than the resistance of the second connecting line 140b.

In one embodiment, at least one connecting line 140 is provided with a hollow area HA. The array substrate 100 further includes an alignment mark 150. The alignment mark 150 is disposed in the non-display area NA. The alignment mark 150 is used for mutual alignment when other components are combined or integrated with the array substrate 100. For example, the alignment mark 150 is used for alignment when a driving chip is integrated with the array substrate 100. Optionally, at least one alignment mark 150 is disposed in the hollow area HA, so that the area occupied by the connecting line 140 is reused as the area occupied by the at least one alignment mark 150, which reduces the additional occupation of the non-display area NA by the alignment mark 150. In this manner, the area of the non-display area NA can be reduced to a certain extent, thereby facilitating the realization of a narrower frame design of the array substrate 100 and the corresponding display panel.

As shown in FIG. 4, in this embodiment, a width of the first connecting line 140a is larger than a width of the second connecting line 140b. The first connecting line 140a is provided with a hollow area HA. When the array substrate 100 further includes alignment marks 150 disposed in the non-display area NA, optionally, at least one alignment mark 150 is disposed in the hollow area HA. Since the first connecting line 140a is connected between the first pad 121 and the second pad 131 which are close to each other, it is easier to configure the width of the first connecting line 140a to be larger than the width of the second connecting line 140b. In this manner, the first connecting line 140a has a sufficient area to reuse as the area of the alignment mark 150, which ensures narrower frame design of the array substrate 100 and the corresponding display panel, and improves layout rationality of the alignment mark 150 and the connecting line 140.

Figure 5:
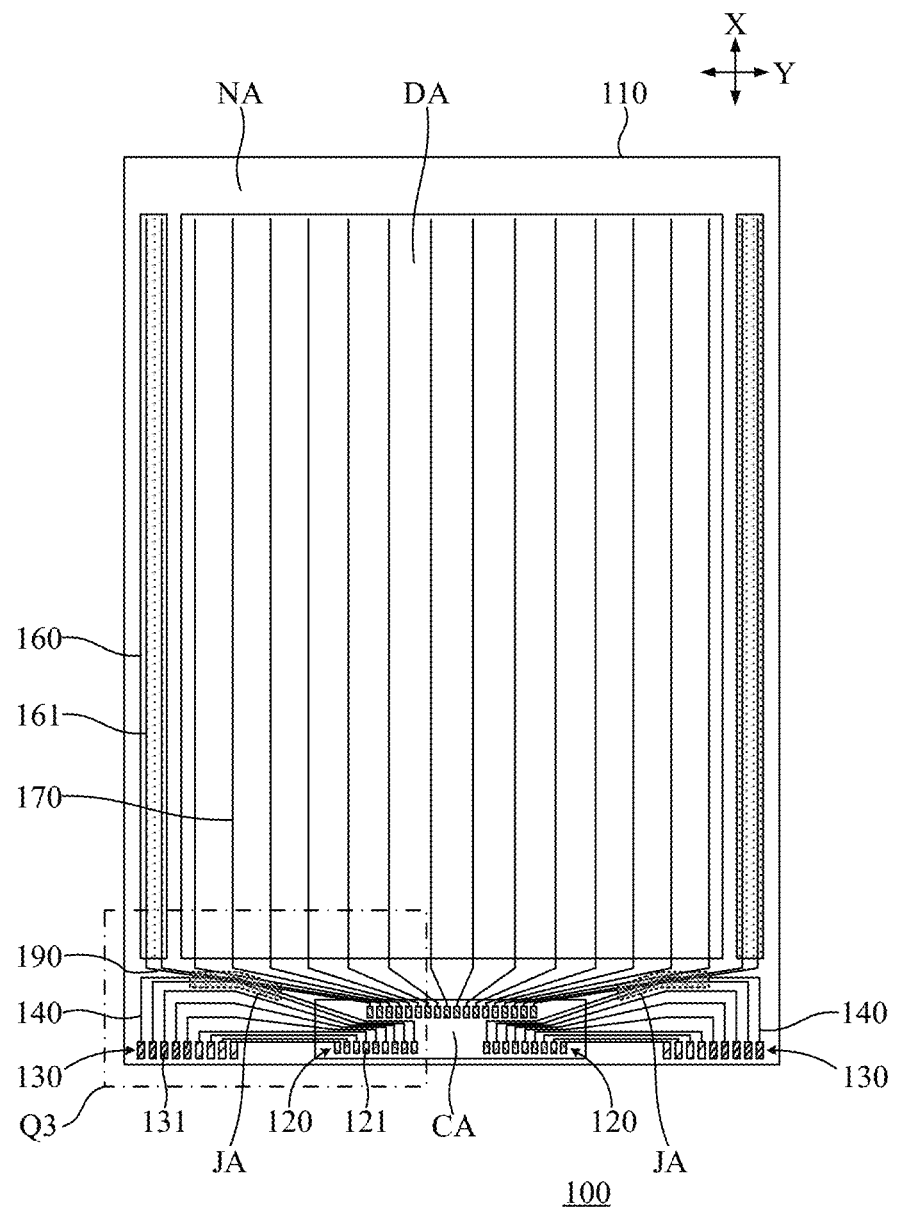
FIG. 5 is a schematic top view of a third embodiment of an array substrate according to the present application.
Figure 6:
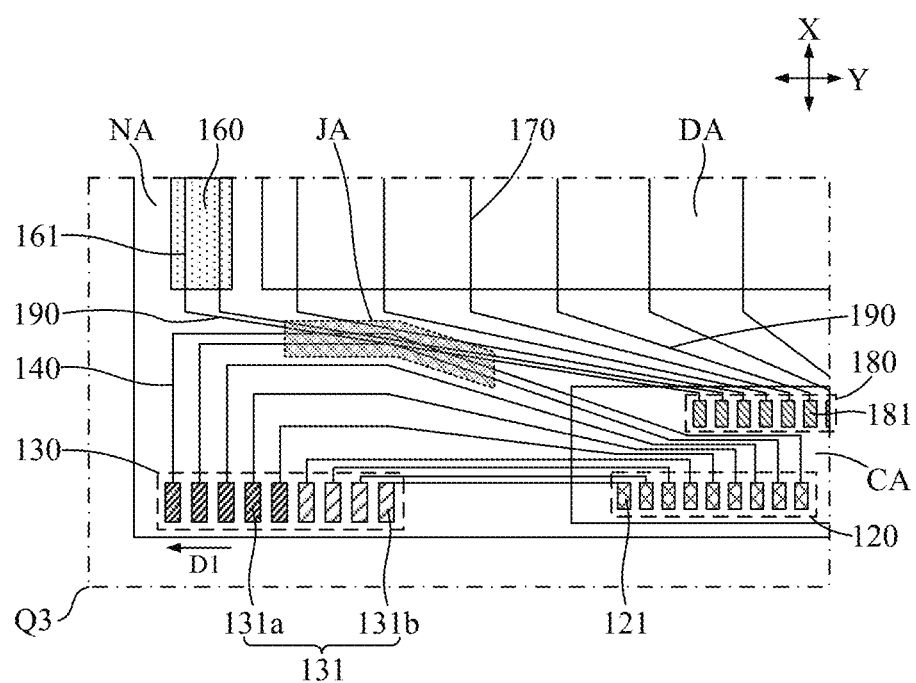
FIG. 6 is a schematic enlarged partial view of a Q3 region shown in FIG. 5.

Referring to FIGS. 5 and 6, a part of the structure of the third embodiment is the same as that of the first embodiment. The differences between the third embodiment and the first embodiment will be described below, and the similarities thereof will not be described in detail.

The array substrate 100 in the third embodiment further includes a gate driving circuit 160, and the gate driving circuit 160 is arranged in the non-display area NA. The gate driving circuit 160 is arranged on at least one side of the display area DA along the second direction Y, and the gate driving circuit 160 includes a plurality of first signal lines 161. In this embodiment, the gate driving circuit 160 is arranged on two sides of the display area DA along the second direction Y. The gate driving circuit 160 may be a driving circuit for generating a scan signal, or a driving circuit for generating a light-emitting control signal.

The array substrate 100 further includes a second signal line 170, and the second signal line 170 extends in the display area DA. For example, the second signal line 170 is a data line for transmitting data signals.

The array substrate 100 further includes a third pad group 180 and a plurality of fan-out lines 190. The third pad group 180 is arranged in the chip integration area CA, and the third pad group 180 is arranged on one side of the first pad group 120 close to the display area DA. The third pad group 180 includes a plurality of third pads 181 arranged in the second direction Y. After the driving chip is integrated with the array substrate 100, the third pad group 180 is configured to connect with an output terminal of the driving chip. One end of each fan-out line 190 is connected to a first signal line 161 or the second signal line 170, and the other end thereof is connected to a third pad 181.

The array substrate 100 includes an array layer on a substrate 110, wherein the array layer includes a plurality of conductor layers and insulation layers insulating the conductor layers from each other.

In this embodiment, the plurality of connecting lines 140 and the plurality of fan-out lines 190 are respectively arranged in different layers. The non-display area NA further includes an overlapping area JA. At least one connecting line 140 extends and crosses the overlapping area JA, and at least one fan-out line 190 extends and crosses the overlapping area JA. An orthographic projection of the connecting line 140 extending and crossing the overlapping area JA on the substrate 110 and an orthographic projection of the fan-out line 190 extending and crossing the overlapping area JA on the substrate 110 overlap with each other. That is, the wiring area of the connecting lines 140 and the wiring area of the fan-out lines 190 partially overlap with each other, and thus the area of the non-display area NA may be used more efficiently. Therefore, the area of the non-display area NA may be reduced to a greater extent, and the width of the non-display area NA on which the chip integration area CA is located may be further reduced, thereby realizing a narrower frame design of the array substrate 100 and the corresponding display panel.

The second pad 131 electrically connected to the connecting line 140 extending and crossing the overlapping area JA is a DC signal pad 131a. That is, the connecting line 140 passing through the overlapping area JA is configured to transmit DC signals, which can avoid signal interference of the connecting line 140 in the overlapping area JA to the fan-out line 190.

One of the plurality of first signal lines 161 electrically connected to the fan-out line 190 extending and crossing the overlapping area JA is a clock signal line. In this manner, there is no large signal interference generated even if projection of the first signal line 161 on the substrate and projection of the connecting line 140 on the substrate overlap with each other in the overlapping area JA. The clock signal line may be a clock signal line used for the scan driving circuit, or may be a clock signal line used for the light-emitting control driving circuit.

In some optional embodiments, the array substrate 100 includes a first conductor layer, a second conductor layer and a third conductor layer arranged in sequence along a direction away from the substrate 110. The first conductor layer is provided with a plurality of scan lines, the second conductor layer is provided with a plurality of reference voltage lines, and the third conductor layer is provided with a plurality of data lines and a plurality of power supply lines. The plurality of connecting lines 140 are arranged in the first conductor layer and/or the second conductor layer, and the plurality of fan-out lines 190 are arranged in the third conductor layer, such that the connecting lines 140 and the fan-out lines 190 are respectively arranged in different layers.

In some optional embodiments, the array substrate 100 includes a first conductor layer, a second conductor layer, a third conductor layer and a fourth conductor layer arranged in sequence along a direction away from the substrate 110. The first conductor layer is provided with a plurality of scan lines, the second conductor layer is provided with a plurality of reference voltage lines, and the third conductor layer and the fourth conductor layer are provided with a plurality of data lines and a plurality of power supply lines. The plurality of connecting lines 140 are arranged in the first conductor layer and/or the second conductor layer, and the plurality of fan-out lines 190 are arranged in the third conductor layer and/or the fourth conductor layer, so that the connecting lines 140 and the fan-out lines 190 are respectively arranged in different layers.

An embodiment of the present application further provides a display panel, which may be a liquid crystal display panel (LCD), an organic light emitting diode (OLED) display panel, a Light Emitting Diode (LED) display panel and so on. The display panel includes the array substrate 100 according to any one of the aforesaid embodiments. The display panel may be provided with a plurality of sub-pixels in the display area DA. For example, when the display panel is an OLED display panel, each sub-pixel is an OLED light-emitting element.

An embodiment of the present application further provides a display module, which includes the display panel according to any one of the aforesaid embodiments of the present application.

Figure 7:
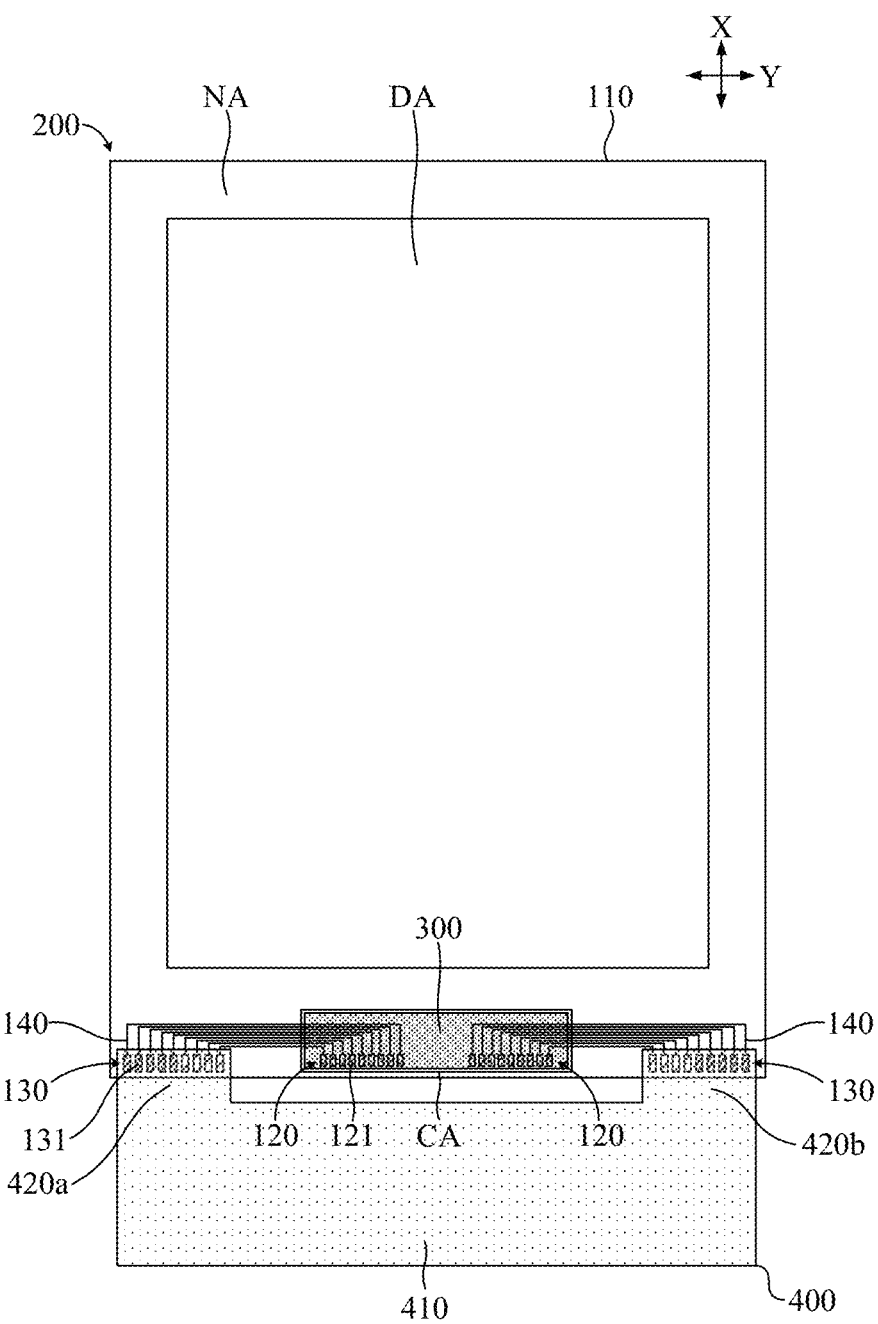
FIG. 7 is a schematic top view of an embodiment of a display module according to the present application.

Referring to FIG. 7, the display module includes a display panel 200, a driving chip 300 and a flexible printed circuit 400. The display panel 200 includes the array substrate 100 according to any one of the aforesaid embodiments.

The driving chip 300 is disposed in the chip integration area CA, and the driving chip 300 is electrically connected to the first pad group 120. In some embodiments, the driving chip 300 includes an input terminal and an output terminal. The aforesaid first pad group 120 is configured to connect with the input terminal of the driving chip 300, and the aforesaid third pad group 180 is configured to connect with the output terminal of the driving chip 300. The flexible printed circuit 400 is electrically connected to the second pad group 130.

In this embodiment, the second pad group 130 is arranged on two sides of the chip integration area CA along the second direction Y. The flexible printed circuit 400 includes a main body part 410, a first connection part 420a and a second connection part 420b. The first connection part 420a and the second connection part 420b are connected to a same side of the main body part 410 along the first direction X and spaced apart from each other in the second direction Y. The first connection part 420a and the second connection part 420b are respectively electrically connected to the second pad group 130 arranged on two sides of the chip integration area CA.

According to the display module of the above embodiment, the second pad group 130 is arranged on two sides of the chip integration area CA along the second direction Y. The first connection part 420a, the second connection part 420b, and the main body part 410 of the flexible printed circuit 400 are connected to form a Y-shaped structure. After the flexible printed circuit 400 is connected to the second pad group 130, the driving chip 300 is arranged between the first connection part 420a and the second connection part 420b. In this manner, additional occupation of the non-display area NA of the display panel 200 in the first direction X by the second pad group 130, the first connection part 420a and the second connection part 420b may be reduced, and the width of the non-display area NA along the first direction X may be reduced as well, thereby facilitating the narrower frame design of the display panel 200.

In accordance with the embodiments of the present application as described above, these embodiments do not exhaustively describe all the details, nor do they limit the application to only the specific embodiments described. Obviously, many modifications and variations are possible in light of the above description. These embodiments are specifically described in this specification to better explain principles and practical usage of the present application, so that those skilled in the art can make good use of the present application and modify and use it based on the present application. This application is to be limited only by the claims, along with their full scope and equivalents.

What is claimed is:
1. An array substrate, comprising:
   a substrate comprising a display area and a non-display area surrounding the display area, wherein the non-display area comprises a chip integration area arranged on one side of the display area along a first direction;

a first pad group arranged in the chip integration area, wherein the first pad group comprises a plurality of first pads arranged along a second direction intersecting with the first direction;

at least one second pad group arranged in the non-display area, wherein the second pad group is arranged on at least one side of the chip integration area along the second direction, and each of the at least one second pad group comprises a plurality of second pads arranged along the second direction; and a plurality of connecting lines configured to electrically connect the second pads with the first pads, wherein lengths of the connecting lines respectively electrically connected to the plurality of second pads in each of the at least one second pad group arranged along a direction away from the first pad group increase, wherein the plurality of second pads in each of the at least one second pad group comprise a plurality of alternating current (AC) signal pads and a plurality of direct current (DC) signal pads arranged on one side of all of the AC signal pads away from the first pad group.

2. The array substrate according to claim 1, wherein the first pads respectively electrically connected to the plurality of second pads in each of the at least one second pad group arranged along a direction away from the first pad group are arranged in sequence along a direction away from the second pad group.

3. The array substrate according to claim 2, wherein the connecting lines respectively electrically connected to the plurality of second pads in each of the at least one second pad group arranged along a direction away from the first pad group are arranged in sequence along the first direction towards the display area.

4. The array substrate according to claim 3, wherein the plurality of connecting lines comprise a first connecting line, wherein one end of the first connecting line is connected to at least one second pad in the second pad group that is closest to the first pad group, and the other end of the first connecting line is connected to at least one first pad in the first pad group that is closest to the second pad group, and wherein the first connecting line extends along the second direction.

5. The array substrate according to claim 4, wherein the plurality of connecting lines further comprise a second connecting line, wherein the second connecting line is arranged on one side of the first connecting line along the first direction towards the display area, wherein the second connecting line comprises a first sub-connecting line, a second sub-connecting line, and a third sub-connecting line connected in sequence, the first sub-connecting line is connected to a first pad, and the third sub-connecting line is connected to a second pad, and wherein an extending direction of at least one part of the first sub-connecting line intersects with the second direction, an extending direction of at least one part of the third sub-connecting line intersects with the second direction, and an extending direction of at least one part of the second sub-connecting line is parallel to the second direction.

6. The array substrate according to claim 5, wherein a width of the first connecting line is larger than a width of the second connecting line.

7. The array substrate according to claim 1, further comprising:

a plurality of alignment marks disposed in the non-display area, wherein at least one of the connecting lines is provided with a hollow area, and at least one alignment mark is disposed in the hollow area.

8. The array substrate according to claim 6, further comprising:

a plurality of alignment marks disposed in the non-display area, wherein the first connecting line is provided with a hollow area, and at least one alignment mark is disposed in the hollow area.

9. The array substrate according to claim 1, wherein the plurality of second pads in each of the at least one second pad group comprises at least two subgroups in sequence along the second direction, each subgroup comprises at least one of the second pads, and in each subgroup, lengths of the second pads along the first direction are equal to each other, and wherein lengths along the first direction of the second pads in the at least two subgroups arranged along a direction away from the first pad group increase.

10. The array substrate according to claim 1, further comprising:

a gate driving circuit arranged in the non-display area, wherein the gate driving circuit is arranged on at least one side of the display area along the second direction, and the gate driving circuit comprises a plurality of first signal lines;

a second signal line arranged in the display area;

a third pad group arranged in the chip integration area, wherein the third pad group is arranged on one side of the first pad group close to the display area, and the third pad group comprises a plurality of third pads arranged in the second direction; and a plurality of fan-out lines, wherein one end of each of the fan-out lines is connected to a first signal line or the second signal line, and the other end of each of the fan-out lines is connected to a third pad.

11. The array substrate according to claim 10, wherein the plurality of connecting lines and the plurality of fan-out lines are respectively arranged in different layers, and the non-display area further comprises an overlapping area, wherein at least one connecting line extends and crosses the overlapping area, at least one fan-out line extends and crosses the overlapping area, and an orthographic projection of the connecting line extending and crossing the overlapping area on the substrate and an orthographic projection of the fan-out line extending and crossing the overlapping area on the substrate overlap with each other.

12. The array substrate according to claim 11, wherein one of the second pads electrically connected to the connecting line extending and crossing the overlapping area is a DC signal pad.

13. The array substrate according to claim 11, wherein one of the plurality of first signal lines electrically connected to the fan-out line extending and crossing the overlapping area is a clock signal line.

14. The array substrate according to claim 11, further comprising a first conductor layer, a second conductor layer and a third conductor layer arranged in sequence along a direction away from the substrate, the first conductor layer is provided with a plurality of scan lines, the second conductor layer is provided with a plurality of reference voltage lines, and the third conductor layer is provided with a plurality of data lines and a plurality of power supply lines, wherein the plurality of connecting lines are arranged in the first conductor layer and/or the second conductor layer, and the plurality of fan-out lines are arranged in the third conductor layer.

15. The array substrate according to claim 11, further comprising a first conductor layer, a second conductor layer, a third conductor layer and a fourth conductor layer arranged in sequence along a direction away from the substrate, the first conductor layer is provided with a plurality of scan lines, the second conductor layer is provided with a plurality of reference voltage lines, and the third conductor layer and the fourth conductor layer are provided with a plurality of data lines and a plurality of power supply lines, wherein the plurality of connecting lines are arranged in the first conductor layer and/or the second conductor layer, and the plurality of fan-out lines are arranged in the third conductor layer and/or the fourth conductor layer.

16. The array substrate according to claim 10, wherein the gate driving circuit is provided on two sides of the display area along the second direction.

17. A display panel, comprising the array substrate according to claim 1.

18. A display module, comprising:
the display panel according to claim 17;
a driving chip arranged in the chip integration area, wherein the driving chip is electrically connected to the first pad group; and
a flexible printed circuit electrically connected to the second pad group.

19. The display module according to claim 18, wherein the second pad group is arranged on two sides of the chip integration area along the second direction, and
wherein the flexible printed circuit comprises a main body part, a first connection part and a second connection part, the first connection part and the second connection part are connected to a same side of the main body part along the first direction and spaced apart from each other in the second direction, and the first connection part and the second connection part are respectively electrically connected to the second pad group arranged on the two sides of the chip integration area.

* * * * *